United States Patent [19]

Schintlmeister et al.

[11] Patent Number: 4,895,770

[45] Date of Patent: Jan. 23, 1990

[54] PROCESS FOR THE MANUFACTURE OF MULTI-LAYERED, COATED HARDMETAL PARTS

[75] Inventors: Wilfried Schintlmeister, Muhl/Reutte; Wolfgang Wallgram, Breitenwang, both of Austria

[73] Assignee: Schwarzkopf Development Corporation, New York, N.Y.

[21] Appl. No.: 238,835

[22] Filed: Aug. 30, 1988

[30] Foreign Application Priority Data

Aug. 31, 1987 [AT] Austria ................... 2173/87

[51] Int. Cl.$^4$ ................... G22F 3/00
[52] U.S. Cl. ................... 428/552; 118/715; 204/192.16; 204/192.362; 204/192.35; 427/248.1; 427/250; 427/255.7; 427/405; 427/419.1; 428/623; 428/627; 428/668; 428/457; 428/698; 428/704; 428/220
[58] Field of Search ................... 428/552, 908.8, 623, 428/627, 668, 457, 698, 704, 220; 427/248.1, 250, 255.7, 405, 419.1; 118/715; 204/192.16, 192.32, 192.35

[56] References Cited

U.S. PATENT DOCUMENTS

| | | |
|---|---|---|
| 4,236,926 | 12/1980 | Lindholm et al. ................... 75/238 |
| 4,239,536 | 12/1980 | Yamamoto et al. ................... 75/238 |
| 4,293,618 | 10/1981 | Hara et al. ................... 428/551 |
| 4,334,928 | 6/1982 | Hara et al. ................... 428/552 |
| 4,442,180 | 4/1984 | Hara et al. ................... 428/551 |
| 4,686,080 | 8/1987 | Hara et al. ................... 428/565 |
| 4,766,040 | 8/1988 | Hillert et al. ................... 428/552 |

FOREIGN PATENT DOCUMENTS

| | | |
|---|---|---|
| 377786 | 9/1984 | Austria . |
| 2263210 | 8/1973 | Fed. Rep. of Germany . |
| 2525185 | 12/1976 | Fed. Rep. of Germany . |
| 3332260 | 3/1985 | Fed. Rep. of Germany . |
| 3502262 | 7/1986 | Fed. Rep. of Germany . |
| 225454 | 7/1985 | German Democratic Rep. . |
| 58-67858 | 4/1983 | Japan . |
| 61-177372 | 8/1986 | Japan . |
| 0015451 | 9/1980 | United Kingdom . |

OTHER PUBLICATIONS

1977 French Paper—Preprints of the 9th Plansee Seminar—May 23–26, 1977.
1981 Plansee Seminar—Zemann et al., Proceedings of the 10th Plansee Seminar 1981, vol. 1, pp. 443 ff.

*Primary Examiner*—Stephen J. Lechert, Jr.
*Attorney, Agent, or Firm*—Morgan & Finnegan

[57] ABSTRACT

The invention relates to a process for the manufacture of multi-layered wear-resistant CVD- or PVD-coatings applied to hardmetal parts containing WC-Co or WC-Ni, where at least one of the layers is a metal-boronitride layer. According to the invention, the boron concentration in the metal-boronitride layer is maintained below the critical level above which in addition a homogeneous boronitride mixed crystal phase a further phase, particularly a diboride phase is formed. A non-boronic, or only slightly boronic, intermediate layer is employed as a diffusion barrier between the hardmetal and the metal-boronitride layer to limit or prevent the formation of brittle tungsten cobalt boron or tungsten nickel boron phases on the external surface of the hardmetal. The metallic boronitride layer can be applied either as a single layer or in multiple layers alternating with other mechanically resistant layers. The hardmetal part is particularly a cutting insert for machining.

21 Claims, No Drawings

PROCESS FOR THE MANUFACTURE OF MULTI-LAYERED, COATED HARDMETAL PARTS

FIELD OF THE INVENTION

The present invention relates to a process for the manufacture of multi-layered wear-resistant CVD-(chemical vapor deposition) or PVD-(physical vapor deposition)coatings applied to hardmetal parts containing WC-Co or WC-Ni. More particularly, the present invention relates to hardmetal parts, such as cutting inserts, having coating layers at least one of which being a metal-boronitride layer.

BACKGROUND OF THE INVENTION

From the very outset in 1970's of the commercial manufacture of hardmetal parts having wear-resistant coatings, the use of borides as layering materials has been desired, e.g., DE-OS 22 63 210. Specification DE-OS 25 25 185 disclosed an intermediate layer of one or more borides and an external layer of aluminum and/or zirconium oxide. The intermediate boride layers therein are deposited for improved adhesion of the oxide protective layer.

But boride containing layers, or borides applied to hardmetal cutting tools, have not enjoyed widespread commercial use. This is surprising in view of the many attempts undertaken to utilize bronoic phases to provide surface protection for hardmetal components subject to wear.

For example, a 1977 French paper (preprints of the 9th PLANSEE Seminar, held May 23–26, 1977) reported titanium boron nitrides deposited onto hardmetals. Compared to TiN coatings of the same thickness (about 10 um), the materials of that report had a tool life clearance face wear resistance two to three times greater than TiN coated materials. The report, however, does not recite results on their resistance against impacts (interrupted cutting) and hence it cannot be determined whether the samples had the toughness required for today's applications. The CVD layers reported therein were generated at temperatures ranging from 1150° and 1450° C. and provided a two-phase composition comprised of a mixture of titanium diboride and titanium boronitride. According to the results reported therein, diborides were formed in a second phase—perhaps as a result of reduced solubility of boron in titanium nitride. Decreased boron in the gaseous mixture during the CVD process did not change this result. According to the Paper, a brittle tungsten cobalt boron phase (WCoB) was formed in the external zone of the WC-Co hardmetals, resulting in a serious disadvantage.

Specification JP 58-67858 proposes applying an aluminum oxide layer to a hardmetal and a TiC intermediate coating wherein the aluminum oxide layer is sandwiched between a Ti(B,N) layer. The boron content in the boronitride coating therein is 5–40 mol%, and the Ti(B,N) layer is formed in two-phases, as titanium diboride and titanium boronitride. The borides in this teaching function to improve layer adhesion.

U.S. Pat. No. 4,239,536 teaches a coated hardmetal having at least one layer of metal-boronitride, and boron carbonitrides, of the elements of subgroups 4 to 6 of the periodic table. These diborides are said to confer increased wear resistance for cutting inserts in machining. But because diborides react with ferrous materials considerably stronger than nitrides, a boride nitride mixed phase is used, having a maximum 50% boron mol content. Comparative tests described in the patent show that inserts with the two-phase layers therein (Ti(B,N)-+TiB$_2$) exhibit longer tool life than single-phase layers (Ti(B,N)), and that optimal tool lives are achieved from boron nitride layers having a 30–30% TiB$_2$ content. The formation of a brittle tungsten cobalt boron external zone in WC-Co hardmetals is compulsory in such instances.

At the 1981 PLANSEE Seminar (in: Proceedings of the 10th PLANSEE Seminar 1981, Vol. 1, pp. 443 ff.), Zemann ct al. reported the deposition of TiB$_2$ layers onto hardmetals from the gaseous phase. Deposition occurred at temperatures ranging from 700°–1070° C. using BBr$_3$ to introduce boron. Widely varying rates of deposition and layer structuring (depending on the coating conditions selected) were reported. The boron produced a brittle tungsten cobalt boron outer phase. The deposition of an intermediate TiC layer is reported to give protection against formation of a tungsten cobalt-boron phase in the hardmetal random zone.

Specification DE-OS 33 32 260 discloses a very economic formation of tungsten cobalt boron phase on the surface of WC/Co hardmetals. The WC/Co hardmetal is treated with boron prior to oxide layers deposition resulting in the generation of the hard and brittle tungsten cobalt boron phase.

A coated hardmetal is also described in specification EU 0 015 451 wherein boron, silica or aluminum are diffused into the hardmetal. Initially, one or more layers of carbides, nitrides, or carbonitrides are applied. Then, a coating of titanium, hafnium, zirconium or tantalum boride or diboride is applied as a protective layer.

U.S. Pat. No. 4,236,926 discloses increased wear resistance via boronization without additional deposition of coatings. The hardmetal is exposed to a gas mixture of boron trihalogenide and hydrogen halogenide at temperatures ranging from 715° and 1000° C.

Other references have proposed using boron. For example, AT-PS 377 786 teaches providing an aluminum oxide layer containing small amounts of boron as a protective, wear-resistant layer for hardmetals. DD-PS 225 454 discloses boride layers applied to ferrous materials. DE-OS 35 02 262 discloses a gaseous, boronic atmosphere for the manufacture of boronic layers using PVD and CVD processes; and, JP-OS 61-177372 teaches production of boron nitride films.

The preceding publications show that many attempts have been undertaken to utilize borides as wear-resistant materials. The diverse nature of the layering conditions utilized, contrasting methods, different goals, structures, materials, compositions, and different layering sequences make it apparent that a single advantageous technique still has not been developed to effectively utilize the advantages borides offer as protective wear-resistant layers. The art still is using carbide- and/or nitride-coated hardmetal inserts in largest measure.

OBJECTS OF THE INVENTION

Accordingly, it is an object of the present invention to improve the wear resistance of hardmetal parts.

It is another object of the invention to improve the wear resistance of hardmetal parts, e.g., cutting inserts containing WC-Co or WC-Ni, by providing a mechanically resistant coating technique.

It is another object of the invention to provide mechanically resistant coating materials containing boron.

Still another object of the invention is to provide a mechanically resistant boron containing coating which substantially reduces susceptibility to brittleness on the substrate surface even when boron containing layers are added.

SUMMARY OF THE INVENTION

According to the present invention a process is provided wherein multi-layered mechanically resistant CVD- or PVD-coatings are applied to hardmetal parts containing WC-Co or WC-Ni. In the process, at least one of the layers is a metal-boronitride layer having a boron concentration below certain critical limits. The process provides a homogeneous boronitride mixed crystal phase, and uses a non-boronic, or only slightly boronic, intermediate layer to provide a diffusion barrier between the hardmetal part and the metal-boronitride layer. As a result, brittle tungsten cobalt boron or tungsten nickel boron phases at the external or outer surface of the hardmetal are largely prevented. The metal-boronitride layer is preferably configured as a titanium boronitride layer with a concentration ranging from 1.5 to 15 atomic percent boron, or as a zirconium boronitride layer having a boron concentration ranging from 1.5 to 15 atomic percent. Single or multilayers comprised of a carbide, nitride or carbonitride of the elements Ti, Zr, and Hf have given particularly satisfactory results.

DETAILED DESCRIPTION OF THE INVENTION

The present invention applies metal boronitride coatings onto hardmetal substrates. The metals of group 4 and 5 of the periodic table of the elements, individually or in a plurality, are suitable for use in the metal-boronitride layer of the invention. Advantageously, the same metals can be used in other layers of the product.

The metal-boronitride layers of the invention have critical boron content upper limits. The amounts vary depending upon the particular materials used, and the conditions of deposition. For example, for a titanium boron nitride layer, the boron content is between about 1 and 20% weight percent, preferably between 1.5 and 15%. On the other hand, the boron content for a zirconium boronitride layer ranges from about 0.05 and 5% weight percent boron, preferably, between 0.1 and 2% boron.

The single-phase metal-boronitride layer can contain other elements. For example, the nitrides can be in the form of carbonitrides, preferably, highly nitrogenous carbon-boronnitrides, having a carbon content comprised of about 50% nitrogen. The metal-boronitride layers can also contain small amounts of oxygen.

The metal-boronitride layers are preferably deposited via the CVD process at temperatures preferably below 1050° C.

The metal-boronitride layers can be deposited in single or multi-layers. In addition, the layers can alternate, e.g., with pure nitride or carbonitrides. The nitride or carbonitride layers can be oxidized, for example, as oxycarbonitride layers. The nitride or carbonitride layers can also contain small amounts of boron. However, the boron content in these layers should be considerably less than in the metal-boronitride layer(s). For a single-layer metal-boronitride, the layer thickness is preferably between 0.1 and 10 um. For multilayered arrangements, the total thickness of the layers can range from 1 to 20 um, preferably between 2 and 12 um.

According to a preferred embodiment of the process, a plurality of metal-boronitride layers, each about 0.5-3 um thick, alternate with, e.g., pure nitride or carbonitride layers which are preferably about 0.1-1 um thick. The alternating layers can repeat 2-3, 7-8, or more times.

Carbides, nitrides and carbonitrides of the 4th and 6th groups of the periodic table provide satisfactory results for intermediate layer(s) deposited between the hardmetal and the metal-boronitride layer. Alternatively, metal-boronitrides of groups 4 and 5 having substantially less boron than in the metal-boronitride layer can be used. The intermediate layer(s) can be single- or multilayered and can be between 1 and 10 um thick, preferably, between 2-6 um.

Oxycarbides, oxynitrides, and oxycarbonitrides can also be incorporated into the intermediate layer.

In addition to the aforestated metal-boronitride layer(s), and intermediate layer(s), oxide layers or predominantly oxidic layer(s) can be incorporated, e.g., an $Al_2O_3$ layer containing $Al_2O_3$, $ZrO_2$, AlON, or $B_2O_3$ can be added. Layers of these compositions can provide additional improvements known to those skilled, depending on the desired machining needs.

The metal-boronitride layer need not be disposed at the outermost layer of the composite. One, or a plurality of layers of mechanically resistant materials of any desired composition can be arranged over the metal-boronitride layer.

In contrast to prior art teachings, the present invention surprisingly provides a single, homogeneous boronitride mixed crystal phase, and an intermediate layer, whereby increased wear-resistant and elastic qualities are obtained. The layers of the invention have surprisingly fine-grain quality and a low tendency to crack. In contrast to pure titanium nitride or titanium carbonitride layers, considerably thicker layers can be formed without the danger of cracking, due, in part, to the improved elasticity of the layers. Surface roughness, in comparison, e.g., with pure nitride and metal-boronitride layers, is also considerably reduced.

By virtue of: (1) the upper limit selected for boron content, (2) the use of an intermediate layer, and (3) the selection of appropriate coating temperatures, boron diffusion into the hardmetal substrate is reduced or eliminated so that reduced susceptibility to embrittlement of the outer zone of the hardmetal substrate is obtained.

The coating temperature according to the invention should be as low as possible. For example, during the CVD process, the coating temperature should not exceed about 1050° C.

It is surprising to find that in a multilayered configuration of TiN and/or Ti(C,N), alternating with Ti(B,N) and/or Ti(B,N,C) layers, increases cratering resistance while the resistance to abrasion provided by the single-phase metal-boronitride layers remains unchanged.

According to its definition, the tungsten carbide-cobalt or tungsten-carbide-nickel hardmetal substrate materials, contain at least predominantly tungsten carbide, cobalt and/or nickel in the hardmetal composition. Additional elements in the substrate added for other purposes is also contemplated.

DETAILED DESCRIPTION OF THE PREFERRED EMBODIMENT

The invention will now be described in greater detail with the aid of the following examples:

EXAMPLE 1

A hardmetal disposable insert containing 2.5% (wt %) TiC, 5.5% Ti(Nb)C, 6% Co, the remainder WC having a SPGN 120308 EN shape, was inserted into a container for CVD-process coating, heated with inert gas at atmospheric pressure, and coated at a temperature of 1030° C. with the following gas compositions and at the following coating times:

(1) 77.6% vol. $H_2$ 2.7% vol. $TiCl_4$ 8.4% vol. $CH_4$ 11.3% vol. Ar Coating time: 35 min.

(2) 77.1–70.2% vol. $H_2$ 2.6–2.4% vol. $TiCl_4$ 2.8–15.3% vol. $N_2$ 6.3–1.9% vol. $CH_4$ 11.2–10.2% vol. Ar A four-step coating cycle was employed. The first and fourth steps were at the values indicated and the second and third steps were at intervening levels. The coating time for Steps 1–3 was 16 minutes each; the coating times for Step 4 was 12 minutes.

Then, the following was added:

(3) 51.4% vol. $H_2$ 1.76% vol. $TiCl_4$ 46.7% vol. $N_2$ 0.14% vol. $BCl_3$ Coating time: 55 min.

Metallographic tests reveal the following layer compositions: the first layer (1) immediately on top of the hardmetal substrate was TiC, 3 um thick. Layer (2) was Ti(C,N), 4 um thick, comprised of four zones of increasing N and decreasing C concentration toward the outer periphery. The final layer (3) was comprised of Ti(N,B), 6 um thick, containing 5.5% (wt %) boron, and having a grain size of about 1 um, about 5 um in the medium.

To compare the insert of the invention, a similarly constructed and coated insert was used, which differed from the first by not having the titanium boronitride layer. Rather, a titanium nitride layer, approximately 5 um long, and approximately 2 um thick was formed.

The coating was performed at the same coating conditions as above; except the third gas composition (3) was changed, as follows:

(3) (Prior art alternative) 51.4% vol. $H_2$ ⅛% vol. $TiCl_4$ 46.8% vol. $N_2$

Both inserts were comparative machine tested. Structural steel of the Ck 45 variety and having a hardness of 700 N/mm² was cut using inserts at the following conditions:

Cutting speed: 220 m.min
Feed: 0.3 mm/r
Depth of cut: 2 mm

| Part subject to wear | Cutting time | Wear index width |
|---|---|---|
| Reference type (TiN) | 12 min | 0.20 mm |
| Type produced per invention (Ti(N,B)) | 12 min | 0.13 mm |
|  | 24 min | 0.18 mm |

The coated insert produced in accordance with the invention exhibited (after a cutting time of 24 minutes) an wear index width of 0.18 mm. In comparison, the prior art insert, after only 12 minutes, exhibited much higher wear, i.e., 0.2 mm for flank wear.

EXAMPLE 2

This example compares the coated insert of the invention with one not having an intermediate layer between the substrate and the metal-boronitride layer.

In variant 2a, a hardmetal containing 0.2% (wt %) TiC, 0.4% Ta(Nb)C, 6% Co, the remainder WC, in the SPGN 120308 EN geometrical shape, was used for both the insert to be coated in accordance with the present invention, and for the reference insert. In variant 2(b) a hardmetal containing 6% Ni, 0.3% $Cr_3C_2$ and 0.3% Mo, the remainder WC, in the same geometrical shape was used.

Coating was performed on both variants 2a and 2b using CVD apparatus at 1000° C. temperature, atmospheric pressure, and the following gas compositions.

For the subject invention:

1. 69.44% vol. $H_2$ 0/80% vol. $TiCl_4$ 29.76% vol. $N_2$ Coating time: 15 min.
2. 69.13% vol. $H_2$ 0/80% vol. $TiCl_4$ 29.63% vol. $N_2$ 0.44% vol. $BCl_3$ Coating time: 60 min.

For the prior art reference:

69.13% vol. $H_2$ 0.80% vol. $TiCl_4$ 29.63% vol. $N_2$ 0.44% vol. $BCl_3$ Coating time: 85 min.

The layer test for variant 2(a) revealed that a 2.5 um thick TiN layer was formed and above it, a 2.5–3 um thick layer of Ti(N,B). In the outer zone of the hardmetal, WCoB and WCoC phase zones averaging 1 um thick, up to 3 um thick were observed. For variant 2(b), the metallographic layer test showed the same layer structure adjacent the hardmetal, with WNiC and WNiC and WNiB phases approximately 1 um thick observable for the outer zone of the hardmetal.

Metallographic tests for the prior art reference material disclosed a single-layer 5–6 um thick Ti(B,N) layer. For variant 2(a), areas with WCoC and WCoB phases up to 5 um thick were observed in the outer zone of the hardmetal. The presence of WNiC and WNiB phases, up to 4 um thick, was also observed.

A testing device was used comprised of a cylinder 230 mm in diameter to which four strips were clamped, having a rectangular cross-section and a stripe width of 6 mm. The strip material was a VEW W300 type steel, tempered to a hardness of 800 N/mm².

For testing purposes, a cutting speed of 150 m/min and a 2 mm depth of cut, feed was continuously increased until failure at the cutting edge.

For the variant 2(b), which had been coated with only one Ti(B,N) layer (the prior art insert), failure occurred at a 0.34 mm/U feed level. In contrast, the disposable insert coated according to the present invention, withstood feeds up to 0/43 mm/U. For variant 2(b), the reference insert coated with only Ti(B,N) failed at a feed of just 0.26% mm/U. In contrast, variant 2(b) coated in accordance with the invention withstood a feed of 0.36 mm/U.

This comparative testing shows that to achieve the toughness levels expected of modern cutting materials, the in-diffusing of boron into the external zone of the hardmetal should be prevented or reduced to very low levels, accomplished by applicants by the selection of a suitable intermediate layer and the corresponding selection of a coating temperature for the metal boronitride layer.

EXAMPLE 3

This example illustrates the variations in the wear behavior characteristic of reversible, throw-away inserts having the same hardmetal composition, and the same shape and intermediate layer, when a multi-layered Ti(N,B) layer is substituted for a single-layered Ti(B,N) layer as the intermediate layer. The type of hardmetal used and the geometric shape of both reference types are the same as in Example 1.

Coating was performed in a CVD apparatus at 1000° C. temperature, standard pressure, with the following gas compositions and coating times:

For the type having a multi-layered Ti(N,B) layer:
1. 77.6% vol. $H_2$ 2.7% vol. $TiCl_4$ 8.4% vol. $CH_4$ 11.3% vol. Ar Coating time: 38 min.
2. 77.1–70.2% vol. $H_2$ 2.6–2.4% vol. $TiCl_4$ 2.8–15.3% vol. $N_2$ 6.3–1.9% vol. $CH_4$ 11.2–10.2% vol. Ar Coating time: 38 min.

A four-step coating cycle was employed, wherein the first and fourth steps were at the values indicated; the second and third were at intervening levels.

Coating time for Steps 1–3: 12 minutes each
Coating time for Step 4: 10 minutes 3. 53.2% vol. $H_2$ 2.4% vol. $TiCl_4$ 46.4% vol. $N_2$ Coating times: 2 min., 1 min., 1 min., 3 min.
4. 53.2% vol. $H_2$ 2.37% vol. $TiCl_4$ 44.3% vol. $N_2$ 0.13% vol. $BCl_3$ Coating times: 17 min., 17 min., 17 min.

Coating with gas compositions 3 and 4 was alternated at the times indicated.

Metallographic results revealed the following layer structure:
3 um TiC
3 um Ti(C,N) (consisting of four layers with varying C and N content, N increasing toward the periphery)
6 um Ti(N,B) and TiN, in the following arrangement:
0.3 um TiN
1.6 um Ti(N,B)
0.2 um TiN
1.6 um Ti(N,B)
0.2 um TiN
1.6 um Ti(N,B)
0.4 um TiN For the type having a single-Ti(N,B) layer; Gas compositions 3 and 4 and coating times were identical to those indicated for the multi-layered type
3. 53.2% vol. $H_2$ 2.37% vol. $TiCl_4$ 44.3% vol. $N_2$ 0.13% vol. $BCl_3$ Coating time: 58 min.

Metallographic results revealed the following layer structure:
3 um TiC
3 um Ti(C,N) (four layers with varying C and N content, N increasing toward the periphery)
6 um Ti(N,B)

REM rupture exposures of the multi-layered Ti(N,B) layer structure revealed (compared to the single-layered Ti(N,B) layer structure) a substantially more uniform and more refined structure.

The machining test was performed by the longitudinal turning of a smooth structural steel rod.

Ck 60 Hardness: 870 N.mm² under the following cutting conditions:
Cutting speed: 140/min
Feed: 0.41 mm/U
Depth of cut: 2 mm

| Layer Type | Cutting Time | Flank Wear | Crater Width |
|---|---|---|---|
| Ti(N,B) single-layered | 18 min. | 0.18 mm | 0.20 mm |
| Ti(N,B) multi-layered | 18 min. 23.5 min. | 0.18 mm 0.19 mm | 0.14 mm 0.20 mm |

By multilayering the Ti(N,B) and TiN layers, a 30% increase in tool life and improved cratering resistance was achieved.

EXAMPLE 4

This example illustrates the variations in the wear behavior characteristic of a reversible, disposable inserts having a layer structure conforming to the multi-layered Ti(N,B) type of Example 3, and a throw away insert having a single-TiN layer on the same TiC-Ti(C,N) intermediate layer during processing of casting materials.

Coating of the reversible, disposable insert having the multi-layered Ti(N,B) layer was performed at the same conditions as those described in Example 3. The same conditions applied for the coating of the intermediate layer.

The gas composition in the precipitation of the TiN layer was:
53.2% vol. $H_2$ 2.4% vol. $TiCl_4$ 44.4% vol. $N_2$ Coating time: 58 min.

Under these conditions, a 6 um thick TiN layer was deposited.

A machining test was performed by the longitudinal rotation of a moderately chilled welding rod having a hardness of 200 HB, at the following cutting conditions:
Cutting speed: 120 m..min
Feed: 0.36 mm/U
Depth of cut: 2 mm

| Layer Type | Cutting Time | Flank Wear |
|---|---|---|
| Ti(N,B) multi-layered | 10 min. | 0.14 mm |
| TiN | 10 min. | 0.23 mm |

Flank wear was 39% lower for the variant having the multi-layered Ti(N,B) layer than for the configuration where a TiN layer was the uppermost layer. From this turning test it is apparent that incorporation of titanium boronitride results in substantial improvements in anti-abrasion characteristics for machined casting materials.

EXAMPLE 5

In this example, a single-layered TiN layer is compared with two-layers comprised of TiN-Ti(N,B), respectively, deposited using the PVD magnetron sputtering process.

Inserts having the SNUN 120408 EN shape and comprised of 6% cobalt, 0.25% TiC, 5.5% Ta(Nb)C, the remainder WC, were placed in a laboratory sputtering apparatus. Two targets were in this apparatus, one made of pure TiN, a second, made of titanium boronitride of 8% boron content. Following standard sputtering etching to clean the substrates, a 3 um thick TiN layer was first deposited with the TiN target and, subsequently, a 7 um thick Ti(B,N) layer was deposited with the titanium boronitride target. In each instance, one DC magnetron discharge was applied.

The following coating conditions were then used:

Power: 800 Watts
Argon pressure: $2 \times 1\text{-}^{-3}$ mbar
BIAS voltage to the substrates: $-800$ Volts
Coating time with the TiN target: 15 minutes Coating time with the Ti(N,B) target: 35 minutes
The uncooled substrates reached, respectively, a temperature of approximately 450° C.

The transition from the TiN target to the Ti(N,B) target took place by the retention of the BIAS voltage to the substrates and brief sputtering etching prior to application of the Ti(N,B) layer.

An approximately 3 um thick layer of TiN was produced, on which a um titanium boronitride layer containing approximately 7% boron was deposited.

For comparison purposes, throw-away inserts were coated with a 10 um thick layer of TiN at the same conditions. Compared to the TiN layer, the titanium boronitride layer showed a substantially more refined structure.

Both reversible, throw-away inserts were subjected to comparative machine testing, using turning testing on Ck 60 structural steel having a hardness of 870 N.mm$^2$ at the following conditions:
Cutting speed: 160 m/min
Feed: 0.41 mm/U
Dept of cut: 2 mm After a turning period of 20 minutes, the insert coated with TiN exhibited flank wear and a wear index width of 0.5 mm, while the insert coated with TiN and Ti(N,B) displayed the same degree of wear but after 36 minutes of turning.

Thus, a significant improvement in flank wear was shown to occur as a result of deposition of the layers of the invention using the PVD process.

What is claimed is:

1. A coated hardmetal part comprised of:
   (a) a WC-Co or WC-Ni hardmetal substrate;
   (b) an intermediate coating on said substrate comprised of TiC and/or TiCN, so as to provide a diffusion barrier to prevent the formation of brittle tungsten cobalt boron or tungsten nickel boron phases in the external zone of the hardmetal part; and
   (c) a metal-boronitride coating on said intermediate layer wherein the boron concentration in said metal-boronitride layer is maintained so as to prevent formation of diboride phase.

2. The part of claim 1 further comprising:
   (d) a plurality of intermediate layers of TiC and/or TiCN.

3. The part of claim 2 further comprising:
   (e) a plurality of metal-boronitride layers wherein the boron concentration is maintained so as to prevent formation of diboride phase.

4. A process for the manufacture of multi-layered, wear-resistant chemical vapor deposition or physical vapor deposition coatings on a hardmetal part, comprising the steps of:
   (a) coating said hardmetal part with an intermediate layer of TiC and/or TiCN, so as to provide a diffusion barrier to prevent the formation of brittle tungsten cobalt boron or tungsten nickel boron phases in the external zone of the hardmetal part; and
   (b) thereafter applying at least one homogeneous metal-boronitride mixed crystal layer to said intermediate layer at temperatures below about 1050° C. with a gas composition comprised of sources of boron and nitrogen, wherein the boron concentration is maintained so as to prevent formation of a diboride phase.

5. A process according to claim 4, further comprising the step of:
   (c) applying a plurality of intermediate layers of TiC and/or TiCN.

6. A process according to claim 5, further comprising the step of:
   (d) applying a plurality of metal-boronitride layers at temperatures below 1050° C., wherein the boron concentration is maintained so as to prevent formation of a diboride phase.

7. A process according to claim 6, wherein the plurality of said metal-boronitride layers are from about 0.5 to about 3 um thick and alternate with said intermediate layers of about 1 to about 10 um thick.

8. A process according to claim 7, wherein said intermediate layers are about 1 to about 10 um thick.

9. A process according to claim 7, wherein said layers repeat.

10. A process according to claim 4, wherein said metal-boronitride layer is selected from the group consisting of nitrides of the Group IV and V elements.

11. A process according to claim 4, wherein said metal-boronitride layer is titanium boronitride comprising a boron concentration of from about 1 to 20 weight percent.

12. A process according to claim 11, wherein said titanium boronitride comprises a boron concentration of from about 1.5 to about 15 weight percent.

13. A process according to claim 4, wherein said metal-boronitride layer is zirconium boronitride comprising a boron concentration of from about 0.05 to about 5 weight percent.

14. A process according to claim 11, wherein said zirconium boronitride comprises a boron concentration of from about 0.1 to about 2 weight percent.

15. A process according to claim 4, wherein said metal-boronitride layer is carbon-boronitride comprising a carbon content of about 50% nitrogen.

16. A process according to claim 4, wherein said intermediate layer is selected from the group consisting of carbides, carbonitrides and nitrides of Group IV and VI elements and each intermediate layer is about 1 to 10 um thick.

17. A process according to claim 6, wherein a plurality of metal-boronitride layers, each about 0.5-3 um thick, are deposited and alternate with pure nitride or carbonitride intermediate layers which are about 0.1-1 um thick.

18. A process according to claim 6, wherein a plurality of metal-boronitride layers, each about 0.5-3 um thick, alternate with pure oxynitride or oxycarbonitride intermediate layers which are about 0.1-1 um thick.

19. A process according to claim 17, wherein a layer composite following the intermediate layer is deposited to an overall layer thickness of about 1 and 20 um.

20. A process for coating a hardmetal disposable insert part, comprised of TiC, Ti(Nb)C, Co and the remainder WC, comprising the steps of:
   (a) inserting said part into a chamber for chemical vapor deposition process coating;
   (b) heating said chamber with an inert gas at atmospheric pressure;
   (c) introducing a first gas composition into said chamber, wherein said first gas composition comprises, H$_2$, TiCl$_4$, CH$_4$ and Ar; then (d) introducing a second gas composition into said chamber, wherein said second gas composition comprises, $H_2$, $TiCl_4$, $N_2$, $CH_4$ and Ar; then
(e) introducing said first gas composition into said chamber; then
(f) introducing said second gas composition into said chamber; and
(g) introducing a third gas composition into said chamber wherein said third gas composition comprises, $H_2$, $TiCl_4$, $N_2$, and $BCl_3$;

whereby step (c) forms a first layer on top of said part comprised of TiC, steps (d)–(e) form a second layer comprised of four zones of increasing nitrogen and decreasing carbon concentration toward the outer periphery, comprised of Ti(C,N) and step (g) forms a third layer comprised of Ti(N,B), and having, a grain size of about 1 um and about 0.5 um in the medium.

21. A process for coating a hardmetal disposable insert part, comprised of TiC, Ta(Nb)C, Co, and, the remainder WC, comprising the steps of:
(a) inserting said part into a sputtering apparatus for physical vapor phase deposition process;
(b) sputtering etching said part to clean the substrates;
(c) applying about a 3 um thick TiN layer with a pure TiN target on said part; and
(d) applying about a 7 um thick Ti(N,B) layer with a target comprised of titanium boronitride on said TiN layer.

* * * * *